US012704779B2

(12) United States Patent
Yamauchi

(10) Patent No.: US 12,704,779 B2
(45) Date of Patent: Aug. 11, 2026

(54) SUBSTRATE TREATMENT METHOD, STORAGE MEDIUM, AND SUBSTRATE TREATMENT APPARATUS

(71) Applicant: Tokyo Electron Limited, Tokyo (JP)

(72) Inventor: Takashi Yamauchi, Koshi City (JP)

(73) Assignee: Tokyo Electron Limited, Tokyo (JP)

(*) Notice: Subject to any disclaimer, the term of this patent is extended or adjusted under 35 U.S.C. 154(b) by 607 days.

(21) Appl. No.: 18/184,141

(22) Filed: Mar. 15, 2023

(65) Prior Publication Data

US 2023/0305389 A1 Sep. 28, 2023

(30) Foreign Application Priority Data

Mar. 25, 2022 (JP) ................................ 2022-050090

(51) Int. Cl.

| | |
|---|---|
| ***G03F 7/00*** | (2006.01) |
| ***G03F 7/16*** | (2006.01) |
| ***G03F 7/20*** | (2006.01) |
| ***H10P 72/30*** | (2026.01) |

(52) U.S. Cl.

CPC ............ *G03F 7/0035* (2013.01); *G03F 7/168* (2013.01); *G03F 7/2041* (2013.01); *H10P 72/3304* (2026.01)

(58) Field of Classification Search

CPC ...... G03F 7/0035; G03F 7/168; G03F 7/2041; G03F 7/0042; H01L 21/67745; H01L 21/0274; H01L 21/67225

USPC .................................................... 430/22, 311

See application file for complete search history.

(56) References Cited

U.S. PATENT DOCUMENTS

| | | | | |
|---|---|---|---|---|
| 6,686,132 | B2 * | 2/2004 | Cheng | G03F 7/38 430/313 |
| 2021/0271170 | A1 * | 9/2021 | Telecky | G03F 7/38 |
| 2022/0308454 | A1 * | 9/2022 | Weidman | G03F 7/0043 |
| 2025/0244672 | A1 * | 7/2025 | Weidman | G03F 7/26 |

FOREIGN PATENT DOCUMENTS

| | | |
|---|---|---|
| JP | H10-275755 A | 10/1998 |
| WO | 2020/264556 A1 | 12/2020 |

* cited by examiner

*Primary Examiner* — Caleen O Sullivan

(74) *Attorney, Agent, or Firm* — Posz Law Group, PLC

(57) ABSTRACT

A substrate treatment method performs a treatment for forming a pattern of a metal-containing resist on a substrate. The method includes changing an acid concentration in a substrate existence space where the substrate exists in a substrate treatment apparatus before a developing treatment of a film of the metal-containing resist.

15 Claims, 16 Drawing Sheets

1
2
G1
G3
G4
32
31
30
30
30
63
62
61
60
100
50
50
50
50
50
50
50
11
21
4
5
3
2
C
13
12
Y 1
2
3
4
5
11
12
13
C
21
40
50
51
52
53
54
55
56
60
61
62
70
80
100
201
202
203
204
G2
G3
G4
D
Y

SUBSTRATE TREATMENT METHOD, STORAGE MEDIUM, AND SUBSTRATE TREATMENT APPARATUS

CROSS REFERENCE TO RELATED APPLICATIONS

This application is based upon and claims the benefit of priority of the prior Japanese Patent Application No. 2022-50090, filed in Japan on Mar. 25, 2022, the entire contents of which are incorporated herein by reference.

TECHNICAL FIELD

This disclosure relates to a substrate treatment method, a storage medium, and a substrate treatment apparatus.

BACKGROUND

A resist coating and developing apparatus disclosed in Japanese Laid-open Patent Publication No. H10-275755 measures the line width of a latent image pattern formed on a substrate surface after exposure by a latent image line width measuring apparatus, and corrects a post baking temperature so as to make a line width of a resist pattern after development appropriate when the line width measured value is out of a range of an appropriate value set in advance.

SUMMARY

An aspect of this disclosure is a substrate treatment method of performing a treatment for forming a pattern of a metal-containing resist on a substrate, which changes an acid concentration in a substrate existence space where the substrate exists in a substrate treatment apparatus before a developing treatment of a film of the metal-containing resist.

DETAILED DESCRIPTION

In a manufacturing process of a semiconductor device or the like, predetermined treatments for forming a resist pattern on a semiconductor wafer (hereinafter, referred to as a "wafer") are performed. The predetermined treatments are, for example, a resist coating treatment of supplying a resist onto the wafer to form a resist film, an exposure treatment of exposing the resist film, a post exposure bake (PEB) treatment of heating so as to promote a chemical reaction in the resist film after the exposure, a developing treatment of developing the exposed resist film to form a resist pattern, and so on.

Regarding the resist pattern, various proposals are made so as to obtain a resist pattern with a desired line width. Further, in recent years, a metal-containing resist may be used as the resist in some cases in place of a chemically amplified resist.

Hence, the present inventors formed a pattern of a negative metal (concretely tin)-containing resist on a wafer formed with a spin-on carbon (SoC) film as a base film using a coating and developing treatment apparatus connected with an exposure apparatus, and carried out Tests A to D for measuring the line width at a plurality of places. FIG. 1 to FIG. 4 are views illustrating measurement results of the line width at portions of the wafer W as results of Tests A to D. Further, in FIG. 1 to FIG. 4, the line width is indicated by gradation, and a smaller line width is shown darker and a larger line width is shown lighter.

For Tests A to D, the same coating and developing treatment apparatus used as before was used except for the following points.

Point that a filter for removing an acid gas is provided at an FFU (fan filter unit) which feeds clean air to the inside of the coating and developing treatment apparatus (the "inside of the coating and developing treatment apparatus" concretely means the inside of a transfer region where wafer transfer is performed between treatment modules and between the treatment module and the exposure apparatus and the inside of each of the treatment modules).

Point that an acid atmosphere treatment module which locally performs an acid atmosphere treatment of spraying a treatment gas containing an acetic acid gas.

In Test A, the following treatments (a) to (e) were performed in order but the aforementioned local acid atmosphere treatment was not performed.

(a) Treatment of forming a film of a metal-containing resist (resist coating treatment)

(b) Treatment of heating a wafer with the film of the metal-containing resist formed thereon (PAB treatment)

(c) Exposure treatment (d) Treatment of heating the wafer so as to promote a chemical reaction in the metal-containing resist film after exposure (PEB treatment)

(e) Developing treatment

In Tests B to D, the treatments were performed in the following order.

Figure 2:
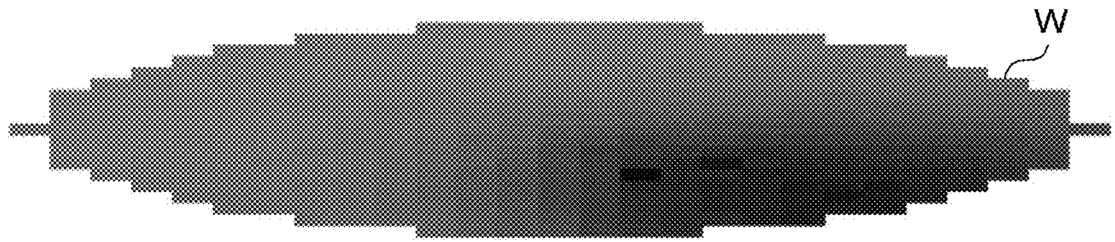
FIG. 2 is a view illustrating a result of Test B.
Figure 3:
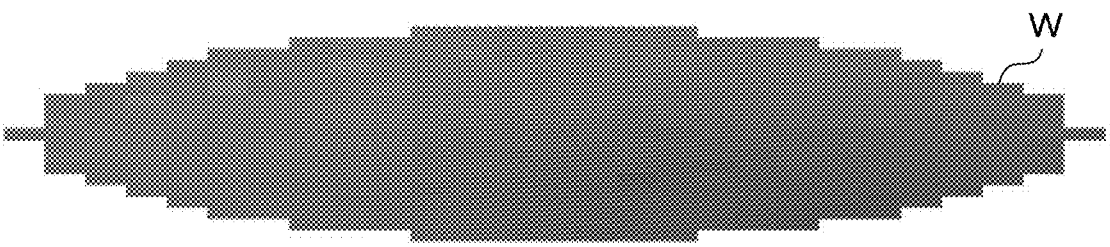
FIG. 3 is a view illustrating a result of Test C.
Figure 4:
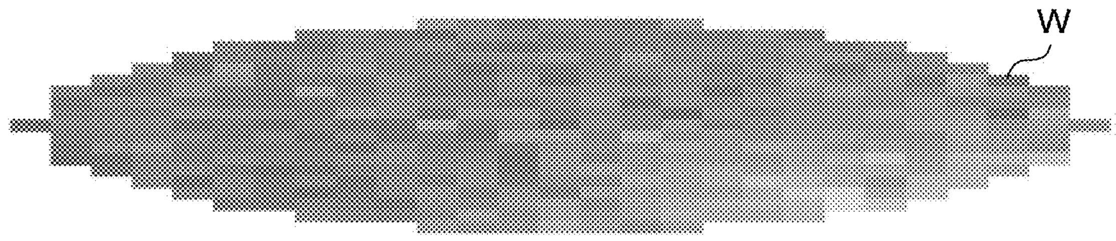
FIG. 4 is a view illustrating a result of Test D.

Test B (a) Resist coating treatment→local acid atmosphere treatment→(b) PAB treatment→(c) exposure treatment→(d) PEB treatment→(e) developing treatment Test C (a) Resist coating treatment→(b) PAB treatment→(c) exposure treatment→local acid atmosphere treatment→(d) PEB treatment→(e) developing treatment Test D (a) Resist coating treatment→(b) PAB treatment→(c) exposure treatment→(d) PEB treatment→local acid atmosphere treatment→(e) developing treatment Further, the target line width was set to 145 nm in Tests A to D, and the acid atmosphere treatment was locally performed at a portion corresponding to a lower right in FIG. 2 to FIG. 4 of the wafer W for 5 to 6 seconds in Tests B to D.

Figure 1:
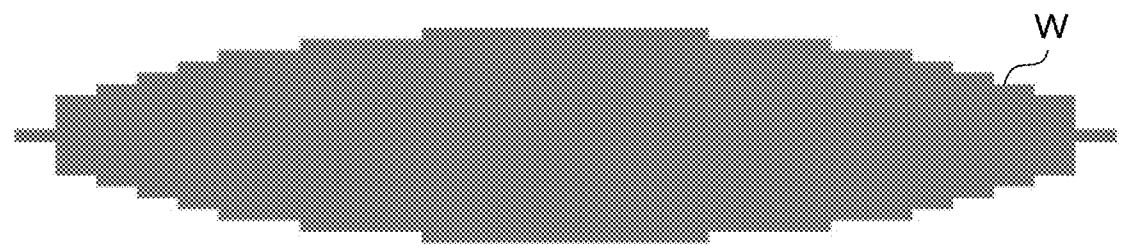
FIG. 1 is a view illustrating a result of Test A.

As illustrated in FIG. 1, in the case of Test A, namely, in the case where the local acid atmosphere treatment was not performed, the line width of the pattern of the metal-containing resist was uniform at the target line width within the wafer.

In contrast to the above, in the case of Test B, namely, in the case where the local acid atmosphere treatment was performed after the resist coating treatment and before the PAB treatment, the line width of the pattern of the metal-containing resist was smaller at a portion to which the acid atmosphere treatment was performed, namely, to which a treatment gas containing acid gas was sprayed.

Besides, in the case of Test C, namely, in the case where the local acid atmosphere treatment was performed after the exposure treatment and before the PEB treatment, the line width of the pattern of the metal-containing resist was smaller at a portion to which the acid atmosphere treatment was performed, but the degree of becoming smaller was lower than that in Test B.

Besides, in the case of Test D, namely, in the case where the local acid atmosphere treatment was performed after the PEB treatment and before the developing treatment, the line width of the pattern of the metal-containing resist was larger at a portion to which the acid atmosphere treatment was performed.

More specifically, the present inventors have found the following (X) to (Z) through Tests A to D.

(X) Performing the acid atmosphere treatment after the resist coating treatment and before the PAB treatment makes it possible to make the line width of the pattern of the metal-containing resist smaller.

(Y) Performing the acid atmosphere treatment after the exposure treatment and before the PEB treatment makes it possible to make the line width of the pattern of the metal-containing resist slightly smaller.

(Z) Performing the acid atmosphere treatment after the PEB treatment and before the developing treatment makes it possible to make the line width of the pattern of the metal-containing resist larger.

A conceivable mechanism that the influence on the line width of the pattern of the metal-containing resist is exactly opposite depending on whether the acid atmosphere treatment is performed before the PEB treatment or after the PEB treatment is as follows.

When a ligand of a metal complex is removed and the metal complex in that state dehydrates and condenses, the metal-containing resist becomes a metal oxide film. This reaction is similar to esterification being a reaction in which a carboxylic acid and alcohol dehydrate and condense. Further, an ester generated by esterification becomes a carboxylic acid and alcohol by hydrolysis. Also the metal oxide film generated by dehydration condensation similarly to the ester is considered to be hydrolyzed similarly to the ester.

In the metal-containing resist, the dehydration condensation and the hydrolysis occur simultaneously, and the hydrolysis is more dominant than the dehydration condensation before exposure. In other words, the hydrolysis is likely to occur.

Further, in an exposed region exposed in the metal-containing resist, the dominance of the hydrolysis is slightly weakened due to the exposure but the hydrolysis is dominant.

Furthermore, in the exposed region in the metal-containing resist, the dehydration condensation becomes far more dominant than the hydrolysis by performing the PEB treatment after the exposure.

Therefore, the exposed region in the metal-containing resist, in which the percentage of the dehydration condensation basically becomes sufficiently larger than the percentage of the hydrolysis at the time of development after the PEB treatment, remains when developed.

Figure 5:
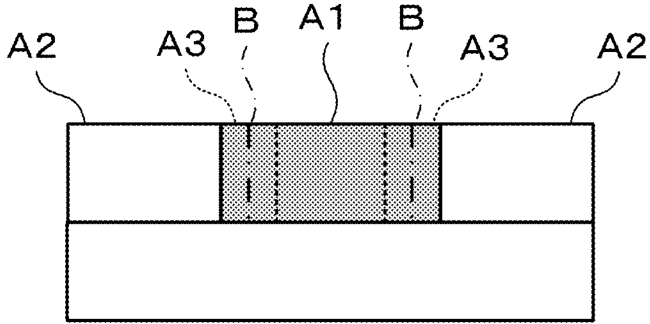
FIG. 5 is a view for explaining an exposed region, an unexposed region, and an intermediately exposed region of a metal-containing resist.

However, as illustrated in FIG. 5, an intermediately exposed region A3 which is exposed but is smaller in exposure amount than the center of an exposed region A1 exists at a portion, close to an unexposed region A2, in the exposed region A1 of the metal-containing resist. The intermediately exposed region A3 becomes gradually smaller in exposure amount toward the unexposed region A2, and therefore a boundary B between a region where the percentage of dehydration condensation is sufficient to remain at development and a region where it is insufficient exists in the intermediately exposed region A3.

Further, the acid gas supplies "$H^+$" as a catalyst to the metal-containing resist to promote both reactions of the hydrolysis and the dehydration condensation. Therefore, when the hydrolysis is originally dominant, the dominance of the hydrolysis increases by the acid gas, whereas when the dehydration condensation is originally dominant, the dominance of the dehydration condensation increases by the acid gas.

Figure 6:
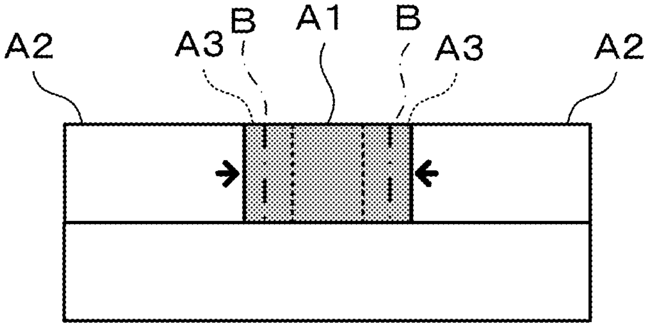
FIG. 6 is a view for explaining a mechanism of a line width of a pattern of the metal-containing resist becoming smaller by an acid atmosphere treatment before a PEB treatment.

Accordingly, the dominance of the hydrolysis further increases by performing the acid atmosphere treatment on the metal-containing resist before the PEB treatment which is originally dominant in hydrolysis (concretely, the metal-containing resist before the exposure and the metal-containing resist after the exposure and before the PEB treatment). Therefore, it is as if the intermediately exposed region A3 and the boundary B have moved toward the center of the exposed region A1 as illustrated in FIG. 6. As a result of this, the line width of the pattern of the metal-containing resist becomes smaller.

Figure 7:
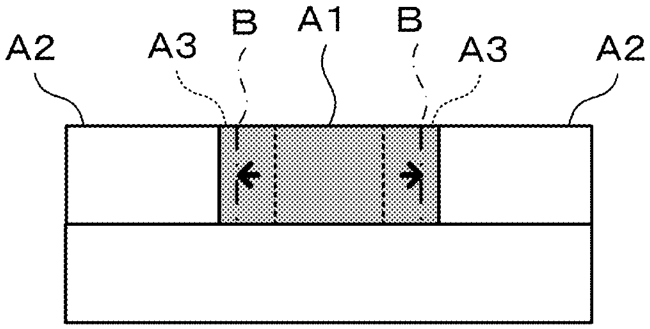
FIG. 7 is a view for explaining a mechanism of the line width of the pattern of the metal-containing resist becoming larger by the acid atmosphere treatment after the PEB treatment.

Besides, the dominance of the dehydration condensation further increases by performing the acid atmosphere treatment on the metal-containing resist after the PEB treatment which is originally dominant in dehydration condensation. Therefore, it is as if the boundary B has moved toward the unexposed region A2 in the intermediately exposed region A3 as illustrated in FIG. 7. As a result of this, the line width of the pattern of the metal-containing resist becomes larger.

The above can be considered as the mechanism that the influence on the line width of the pattern of the metal-containing resist is exactly opposite depending on whether the acid atmosphere treatment is performed before the PEB treatment or after the PEB treatment.

On the basis of the above, the technique according to this disclosure provides novel substrate treatment method and substrate treatment apparatus capable of controlling the line width of a resist pattern using a metal-containing resist based on the aforementioned findings.

Hereinafter, a substrate treatment method and a substrate treatment apparatus according to this embodiment will be explained with reference to the drawings. Note that in this description and the drawings, the same codes are given to elements having substantially the same functional configurations to omit duplicate explanations.

Coating and Developing Treatment Apparatus

Figure 8:
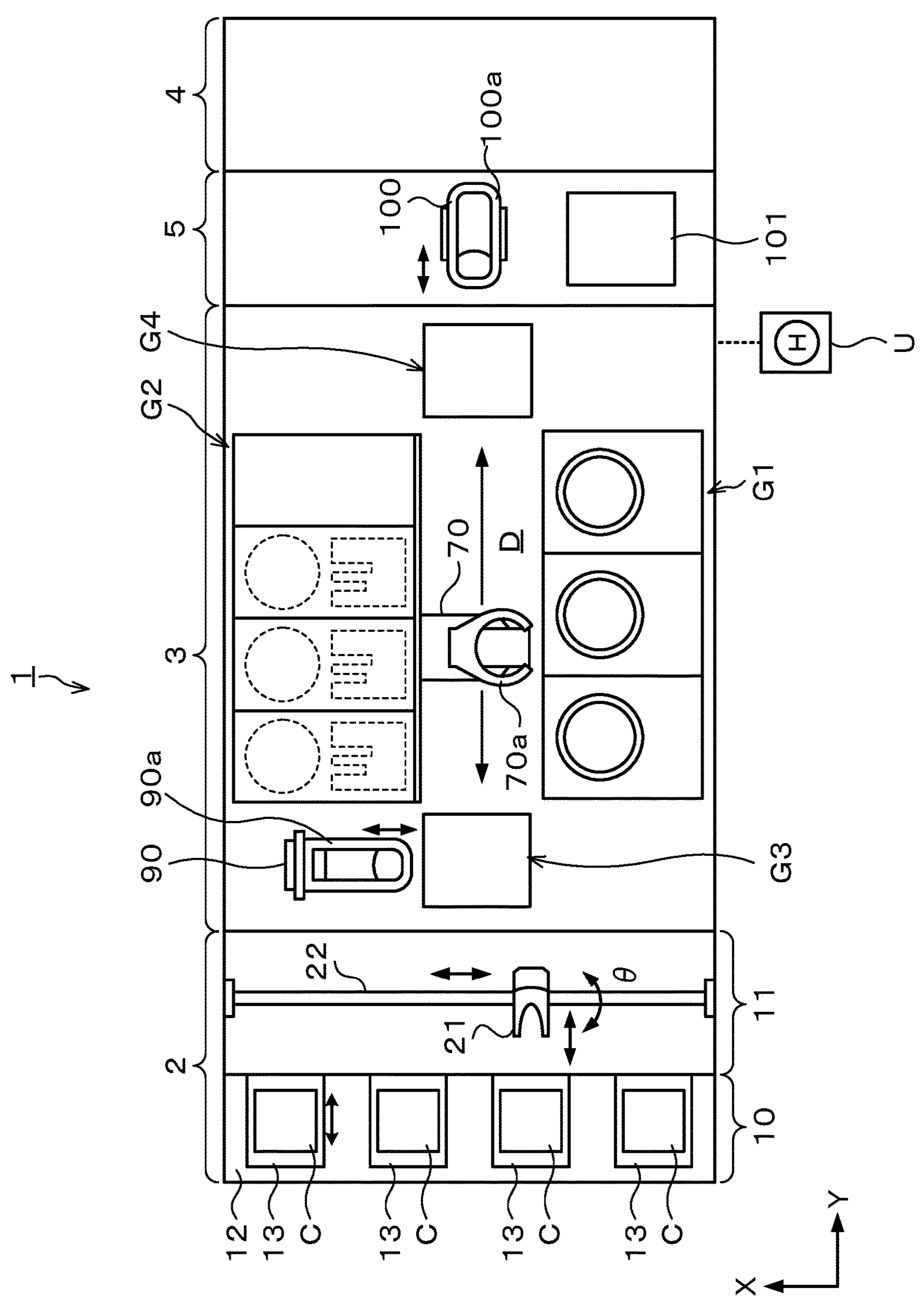
FIG. 8 is an explanatory view illustrating the outline of an internal configuration of a coating and developing treatment apparatus as a substrate treatment apparatus according to this embodiment.
Figure 9:
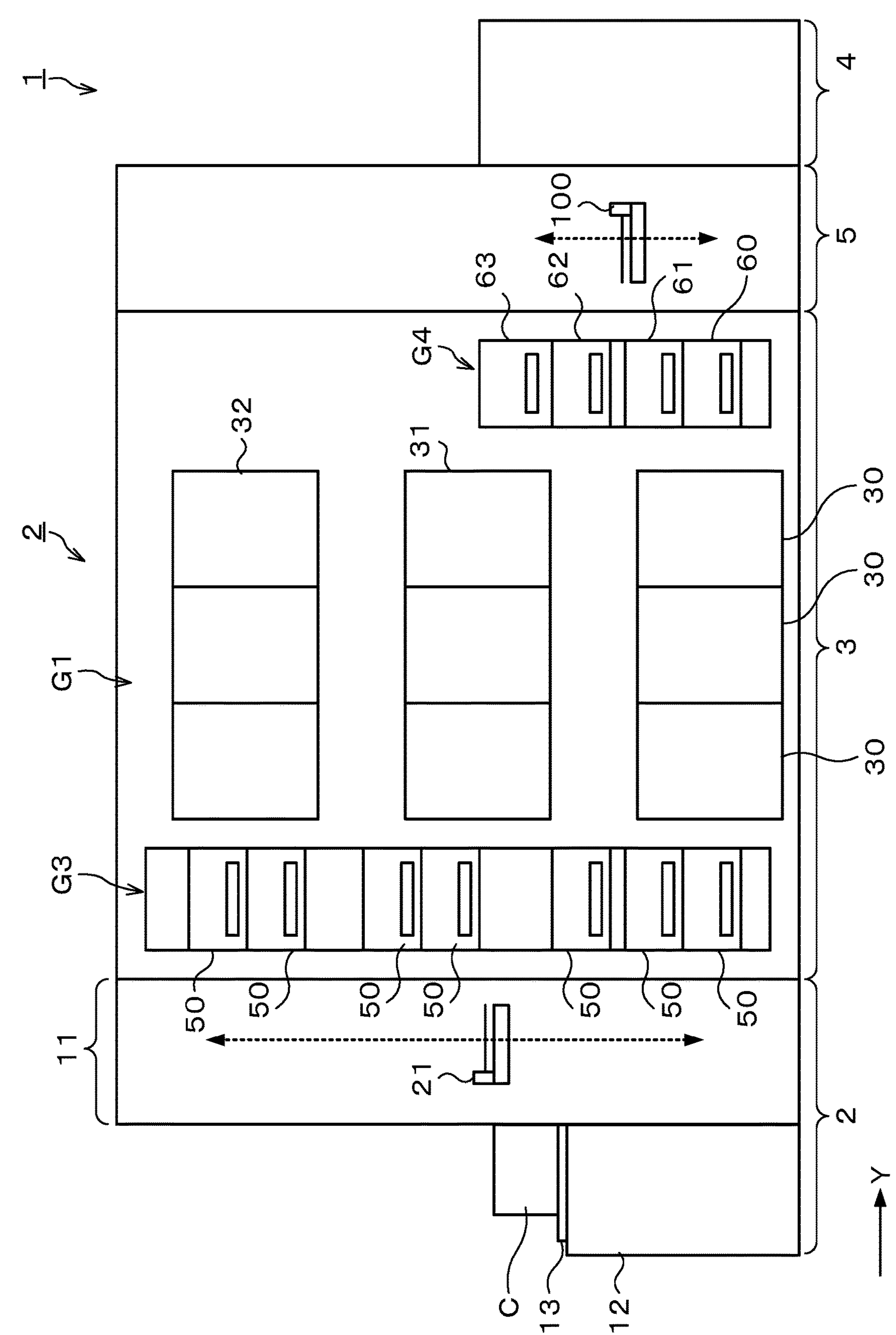
FIG. 9 is a view illustrating the outline of the internal configuration on a front side of the coating and developing treatment apparatus in FIG. 8.
Figure 10:
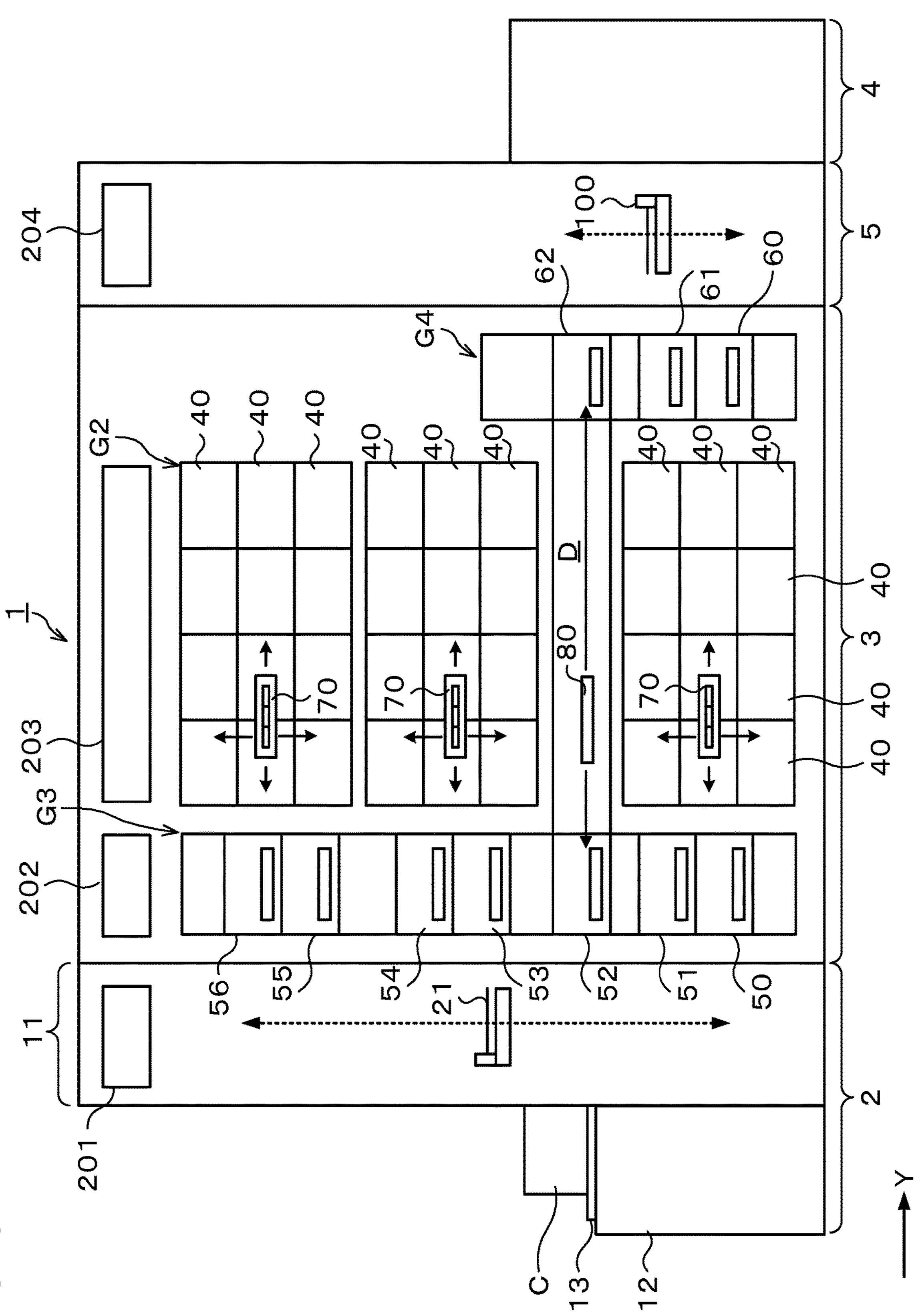
FIG. 10 is a view illustrating the outline of the internal configuration on a rear side of the coating and developing treatment apparatus in FIG. 8.

FIG. 8 is an explanatory view illustrating the outline of an internal configuration of a coating and developing treatment apparatus as a substrate treatment apparatus according to this embodiment. FIG. 9 and FIG. 10 are views illustrating the outline of the internal configuration on a front side and a rear side of the coating and developing treatment apparatus 1, respectively.

The coating and developing treatment apparatus 1 forms a resist pattern on the wafer W as a substrate using a negative metal-containing resist. Note that the metal contained in the metal-containing resist is optional and is tin in this embodiment.

The coating and developing treatment apparatus 1 has, as illustrated in FIG. 8 to FIG. 10, a cassette station 2 into/out of which a cassette C being a container capable of housing a plurality of wafers W is transferred, and a treatment station 3 including a plurality of various treatment units which perform the predetermined treatments such as the resist coating treatments. The coating and developing treatment apparatus 1 further has a configuration in which the cassette station 2, the treatment station 3, and an interface station 5 which delivers the wafer W to/from an exposure apparatus 4 adjacent to the treatment station 3 are integrally connected.

The cassette station 2 is divided into, for example, a cassette transfer in/out section 10 and a wafer transfer section 11. The cassette transfer-in/out section 10 is provided, for example, at an end on a Y-direction negative direction (left direction in FIG. 8) side in the coating and developing treatment apparatus 1. In the cassette transfer-in/out section 10, a cassette stage 12 is provided. On the cassette stage 12, a plurality of, for example, four stage plates 13 are provided. The stage plates 13 are provided side by side in a row in an X-direction being a horizontal direction (an up-down direction in FIG. 8). On the stage plates 13, cassettes C can be mounted when the cassettes C are transferred in/out from/to the outside of the coating and developing treatment apparatus 1.

In the wafer transfer section 11, a transfer unit 20 is provided which transfers the wafer W. The transfer unit 20 is configured to be movable on a transfer path 21 extending in the X-direction. The transfer unit 20 is movable also in the up-down direction and around a vertical axis (in a θ-direction), and can transfer the wafer W between the cassette C on each of the stage plates 13 and a later-explained delivery unit in a third block G3 in the treatment station 3.

In the treatment station 3, a plurality of, for example, first to fourth four blocks G1, G2, G3, G4 each including various units are provided. For example, the first block G1 is provided on the front side (an X-direction negative direction side in FIG. 8) in the treatment station 3, and the second block G2 is provided on the rear side (an X-direction positive direction side in FIG. 8) in the treatment station 3. Further, the third block G3 is provided on the cassette station 2 side (a Y-direction negative direction side in FIG. 8) in the treatment station 3, and the fourth block G4 is provided on the interface station 5 side (a Y-direction positive direction side in FIG. 8) in the treatment station 3.

In the first block G1, as illustrated in FIG. 9, a plurality of solution treatment units, for example, a developing treatment unit 30 and a resist coating unit 30 are arranged in this order from the bottom. The developing treatment unit 30 performs a developing treatment on the wafer W. Specifically, the developing treatment unit 30 performs a developing treatment on a metal-containing resist film of the wafer W subjected to the PEB treatment. The resist coating unit 31 applies a metal-containing resist to the wafer W to form a film of the metal-containing resist, namely, a metal-containing resist film.

The developing treatment unit 30 and the resist coating unit 31 are provided, for example, three each arranged side by side in the horizontal direction. Note that the numbers and the arrangement of the developing treatment units 30 and the resist coating units 31 can also be arbitrarily selected.

In each of the developing treatment unit 30 and the resist coating unit 31, for example, a predetermined treatment solution is applied onto the wafer W by a spin coating method. In the spin coating method, the treatment solution is discharged onto the wafer W, for example, from a discharge nozzle and the wafer W is rotated to diffuse the treatment solution over a surface of the wafer W.

Further, in this embodiment, an acid atmosphere treatment unit 32 is provided in the first block G1 as an acid concentration change part which performs, on the wafer W, a treatment (hereinafter, an acid concentration change treatment) of changing the acid concentration in a later-explained wafer existence space (an example of a substrate existence space according to this disclosure). The acid atmosphere treatment unit 32 performs a treatment of increasing the acid concentration in the treatment space where a predetermined treatment such as the acid concentration change treatment is performed on the wafer W, as the acid concentration change treatment. The acid concentration change treatment performed by the acid atmosphere treatment unit 32 is more specifically an acid atmosphere treatment of locally spraying the treatment gas containing acid gas to the wafer W.

For example, three acid atmosphere treatment units 32 are arranged side by side in the horizontal direction above the resist coating units 31. The number and the arrangement of the acid atmosphere treatment units 32 can be arbitrarily selected. The configuration of the acid atmosphere treatment unit 32 will be explained later.

For example, in the second block G2, thermal treatment units 40 which perform thermal treatments such as heating and cooling on the wafer W are provided one above the other in the up-down direction and side by side in the horizontal direction as illustrated in FIG. 9. The number and the arrangement of the thermal treatment units 40 can also be arbitrarily selected. Note that the thermal treatment unit 40 performs the PAB treatment, the PEB treatment, the post baking treatment (hereinafter, referred to as "POST treatment") of heat-treating the wafer W after the developing treatment, or the like.

In the third block G3, for example, a plurality of delivery units 50, 51, 52, 53, 54, 55, 56 are provided in order from the bottom. Further, in the fourth block G4, a plurality of delivery units 60, 61, 62 are provided in order from the bottom.

As illustrated in FIG. 8, in a region surrounded by the first block G1 to the fourth block G4, a wafer transfer region D is formed. In the wafer transfer region D, for example, a wafer transfer unit 70 is arranged as a substrate transfer unit for transferring the wafer W.

The wafer transfer unit 70 has a transfer arm 70*a* movable, for example, in the Y-direction, the θ-direction, and the up-down direction. The wafer transfer unit 70 can move the transfer arm 70*a* holding the wafer W in the wafer transfer region D and transfer the wafer W to predetermined units in the first block G1, the second block G2, the third block G3, and the fourth block G4 therearound. A plurality of the wafer transfer units 70 are arranged one above the other as illustrated in FIG. 10, each of which can transfer the wafer W, for example, to a predetermined unit at similar heights in the blocks G1 to G4.

Further, in the wafer transfer region D, a shuttle transfer unit 80 is provided which linearly transfers the wafer W between the third block G3 and the fourth block G4.

The shuttle transfer unit 80 can linearly move the wafer W supported thereon in the Y-direction and transfer the wafer W between the delivery unit 51 in the third block G3 and the delivery unit 60 in the fourth block G4 at similar heights.

As illustrated in FIG. 8, a wafer transfer unit 90 is provided on the X-direction positive direction side of the third block G3. The wafer transfer unit 90 has a transfer arm 90*a* that is movable, for example, in the θ-direction and the up-down direction. The wafer transfer unit 90 can move the transfer arm 90*a* supporting the wafer W up and down to transfer the wafer W to each of the delivery units in the third block G3.

In the interface station 5, a transfer unit 100 and a delivery unit 101 are provided. The transfer unit 100 has a transfer arm 100*a* that is movable, for example, in the θ-direction and the up-down direction. The wafer transfer unit 100 can transfer the wafer W to/from each of the delivery units in the fourth block G4, the delivery unit 101, and the exposure apparatus 4, while supporting the wafer W by the transfer arm 100*a*.

Here, a space where the wafer W exists in the coating and developing treatment apparatus 1 (concretely, in the wafer transfer section 11) is assumed to be a wafer existence space. The coating and developing treatment apparatus 1 includes a treatment space and a transfer space as the wafer existence space.

The treatment space is a space where a predetermined treatment is performed on the wafer W as explained above, and is concretely a space in the resist coating unit 31 and a space in the acid atmosphere treatment unit 32.

The transfer space is a space where the transfer unit for transferring the wafer W to the treatment space is provided, and is concretely a space where the transfer unit 70, 90, 100 and the like are provided.

Further, in the coating and developing treatment apparatus 1, FFUs 201 to 204 which feed clean air are provided in the aforementioned transfer space as illustrated in FIG. 10.

In the coating and developing treatment apparatus 1, the acid concentration in the aforementioned transfer space is maintained equal to or lower than a minimum acid concentration in the treatment space of the acid atmosphere treatment unit 32 so as to obtain a desired result by the treatment by the acid atmosphere treatment unit 32. Concretely, each of the FFUs 201 to 204 is provided with a filter (not illustrated) which removes the acid gas, so that clean air from which the acid gas has been removed is fed to the transfer space from the FFUs 201 202, 203.

Further, FFUs (not illustrated) provided in the treatment units (for example, the developing treatment unit 30, the resist coating unit 31, the thermal treatment unit 40 and the like) other than the acid atmosphere treatment unit 32 may be provided with filters (not illustrated) which remove the acid gas.

The above coating and developing treatment apparatus 1 is provided with a controller U as illustrated in FIG. 8. The controller U is a computer including, for example, a processor such as CPU, a memory, and so on, and has a program storage (not illustrated). In the program storage, a program is stored which controls a later-explained wafer treatment by controlling the operations of the above various treatment units and various transfer units. Note that the above program may be the one recorded in a computer-readable storage medium H and installed from the storage medium H into the controller U. The storage medium H may be a transitory one or a non-transitory one. Part or all of the program may be realized by dedicated hardware (circuit board).

Acid Atmosphere Treatment Unit

Figure 11:
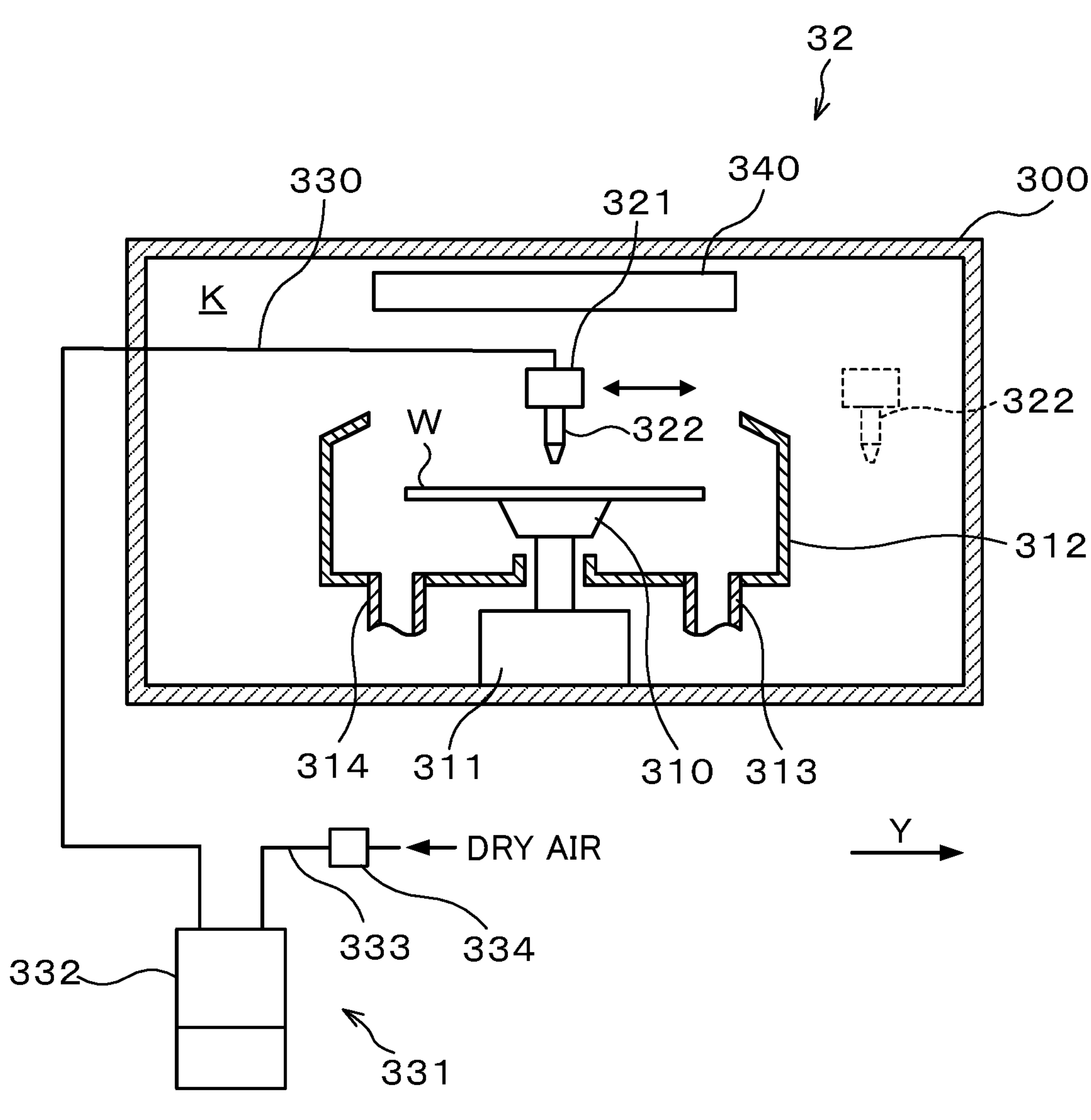
FIG. 11 is a longitudinal sectional view illustrating the outline of a configuration of an acid atmosphere treatment unit.
Figure 12:
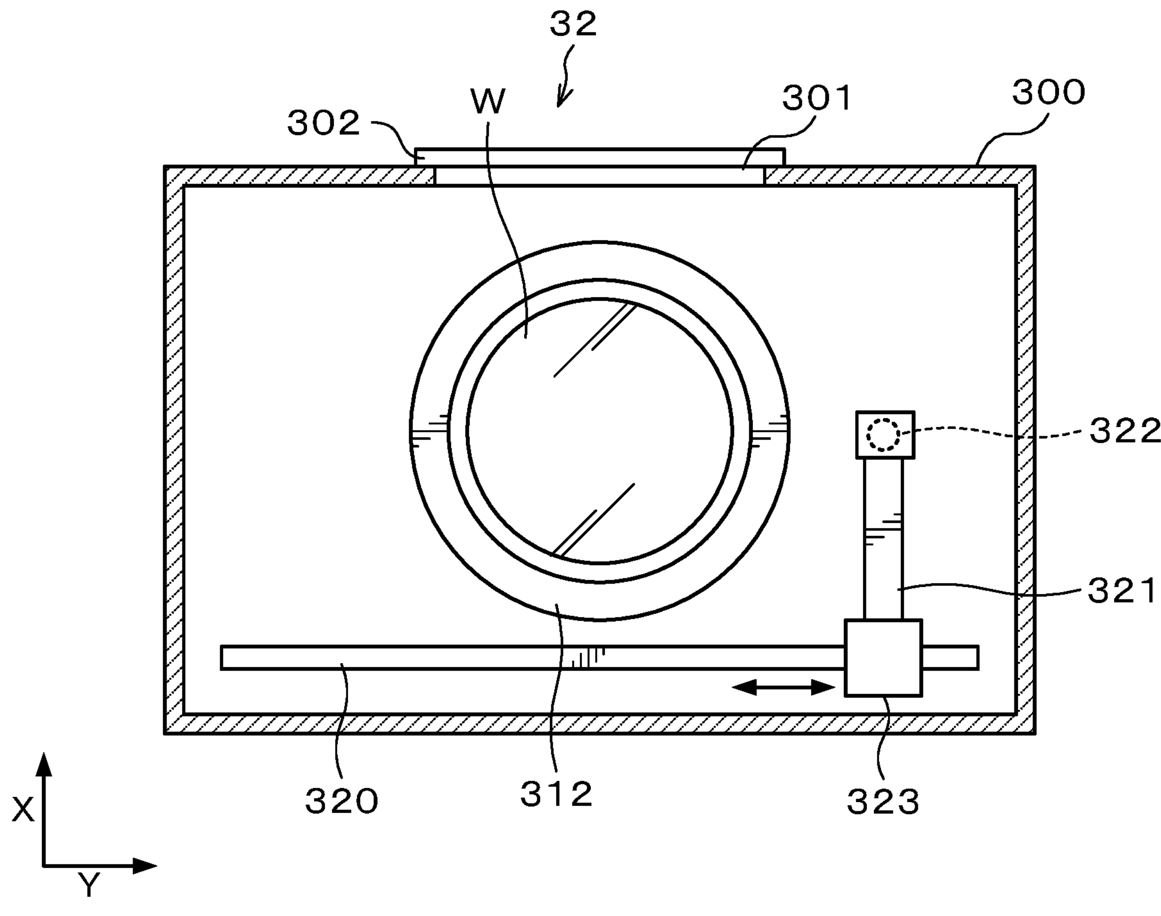
FIG. 12 is a transverse sectional view illustrating the outline of the configuration of the acid atmosphere treatment unit.

Subsequently, the configuration of the above acid atmosphere treatment unit 32 will be explained. FIG. 11 and FIG. 12 are a longitudinal sectional view and a transverse sectional view illustrating the outline of the configuration of the acid atmosphere treatment unit 32, respectively.

The acid atmosphere treatment unit 32 has a treatment container 300 whose inside is closable as illustrated in FIG. 11. The treatment container 300 forms a treatment space K therein. A side surface of the treatment container 300 is formed with a transfer-in/out port 301 for the wafer W, and an opening and closing shutter 302 is provided at the transfer-in/out port 301 as illustrated in FIG. 12.

At a center portion in the treatment container 300, a spin chuck 310 which holds and rotates the wafer W is provided as illustrated in FIG. 11. The spin chuck 310 has a horizontal upper surface, and the upper surface is provided with, for example, a suction port (not illustrated) for sucking the wafer W. By suction through the suction port, the wafer W can be suction-held on the spin chuck 310.

The spin chuck 310 is connected to a chuck drive mechanism 311 and can rotate at a desired speed by the chuck drive mechanism 311. The chuck drive mechanism 311 has a rotation drive source (not illustrated) such as a motor which generates a driving force for rotating the spin chuck 310. Further, the chuck drive mechanism 311 is provided with a raising and lowering drive source such as a cylinder so that the spin chuck 310 can freely move up and down.

Around the spin chuck 310, a cup 312 is provided which receives and collects liquid splashing or dropping from the wafer W. A drain pipe 313 which drains the collected liquid and an exhaust pipe 314 which exhausts the atmosphere in the cup 312 are connected to a lower surface of the cup 312.

As illustrated in FIG. 12, on an X-direction negative direction (lower direction in FIG. 12) side of the cup 312, a rail 320 is formed which extends along a Y-direction (a right-left direction in FIG. 12). The rail 320 is formed, for example, from an outer position on the Y-direction negative direction (left direction in FIG. 12) side to an outer position on the Y-direction positive direction (right direction in FIG. 12) side of the cup 312. To the rail 320, an arm 321 is attached.

On the arm 321, a discharge nozzle 322 is supported as illustrated in FIG. 11 and FIG. 12. The discharge nozzle 322 discharges dry air containing an acetic acid gas as the treatment gas containing acid gas toward a portion of the wafer W held on the spin chuck 310. The arm 321 is movable on the rail 320 by a nozzle drive 323 illustrated in FIG. 12. This allows the discharge nozzle 322 to move from the outer position on the Y-direction positive direction side of the cup 312 to a position above a center portion of the wafer W in the cup 312. Further, the arm 321 is movable up and down by the nozzle drive 323, and is able to adjust the height of the discharge nozzle 322.

The discharge nozzle 322 is connected to a supply mechanism 331 via a supply pipe 330 as illustrated in FIG. 11.

The supply mechanism 331 supplies the dry air containing acetic acid gas to the discharge nozzle 322. The supply mechanism 331 has, for example, a bottle 332 which stores an acetic acid, a supply pipe 333 which supplies dry air to the bottle 332, and an opening/closing valve 334 provided along the supply pipe 333. By supplying dry air from a supply source (not illustrated) of the dry air to the bottle 332 via the supply pipe 333, the dry air containing acetic acid gas can be supplied to the discharge nozzle 322 via the supply pipe 330. The supply mechanism 331 is controlled by the controller U.

Further, an FFU 340 which feeds clean air downward is provided above the cup 312. The FFU 340 is provided with a filter (not illustrated) which removes an acid gas and is configured to feed clean air from which the acid gas has been removed toward the wafer W held on the spin chuck 310.

Wafer Treatment

Next, examples of the wafer treatment using the coating and developing treatment apparatus 1 will be explained. All Examples 1 to 4 of the wafer treatment explained below are treatments for forming a pattern of the metal-containing resist on the wafer W. Further, all Examples 1 to 4 of the wafer treatment perform the acid atmosphere treatment as the acid concentration change treatment between completion of the transfer of the wafer W to the inside of the coating and developing treatment apparatus 1 (concretely, the inside of the wafer transfer section 11) and the developing treatment. However, Examples 1 to 4 of the wafer treatment are different from one another in timing when performing the acid atmosphere treatment. Further, the surface of the wafer W to be used in Examples 1 to 4 of the wafer treatment, an SoC film has been formed in advance as a base film of the metal-containing resist film. Note that all of Examples 1 to 4 of the wafer treatment are performed under control of the controller U.

Example 1 of the Wafer Treatment

Figure 13:
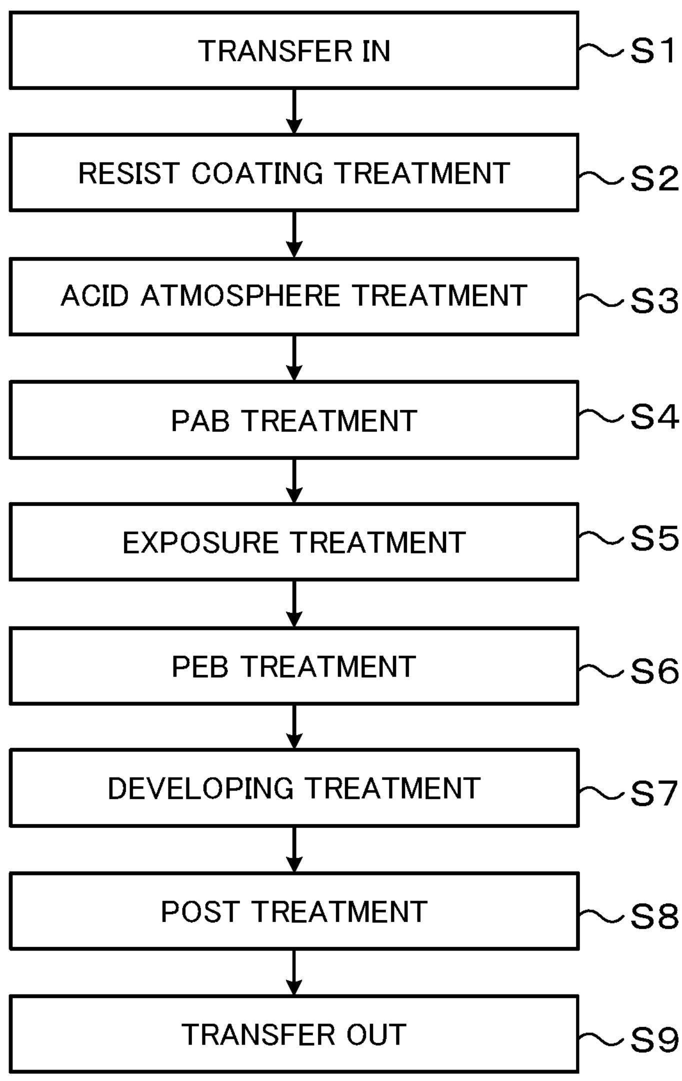
FIG. 13 is a flowchart illustrating main steps of Example 1 of a wafer treatment.

FIG. 13 is a flowchart illustrating main steps of Example 1 of the wafer treatment. In Example 1 of the wafer treatment, the acid atmosphere treatment is performed between the resist coating treatment and the exposure treatment. More specifically, in Example 1 of the wafer treatment, the acid atmosphere treatment is performed after the resist coating treatment and before the PAB treatment based on the above finding (X).

Step S1

In Example 1 of the wafer treatment, first, the wafer W is transferred to the inside of the coating and developing treatment apparatus 1.

Specifically, the cassette C housing a plurality of wafers W is transferred into the cassette station 2 of the coating and developing treatment apparatus 1 and mounted on the stage plate 13. Then, the wafers W in the cassette C are successively taken out by the transfer unit 20 and transferred to the inside of the wafer transfer section 11 and transferred to the delivery unit 53 in the third block G3 in the treatment station 3.

Step S2

Next, the resist coating treatment is performed to form a metal-containing resist film on the wafer W.

Specifically, the wafer W is transferred by the transfer unit 70 to the resist coating unit 31, in which the metal-containing resist is applied by rotation onto the surface of the wafer W, whereby the metal-containing resist film is formed in a manner to cover the SoC film as the base film.

Step S3

Subsequently, the acid atmosphere treatment is performed.

Specifically, the wafer W is transferred by the transfer unit 70 to the acid atmosphere treatment unit 32 and held on the spin chuck 310. Subsequently, the discharge nozzle 322 is moved to above a predetermined treatment target region of the wafer W held on the spin chuck 310, and supplies the dry air containing acetic acid gas toward the treatment target region. The treatment target region is, for example, a region in which the line width of the metal-containing resist will become larger than that in the other region if the acid atmosphere treatment is not performed to the treatment target region (namely, if the dry air containing acetic acid gas is not supplied). Further, the supply time of the dry air containing acetic acid gas is, for example, 5 to 10 seconds. This supplies $H^+$ as a catalyst to the surface of the metal-containing resist film in the treatment target region.

At the supply of the dry air containing acetic acid gas, the supply of the clean air is also performed from the FFU 340 to the wafer W held on the spin chuck 310. This can prevent the dry air containing acetic acid gas from reaching a region other than the treatment target region of the wafer W, and prevent the region other than the treatment target region from being subjected to the acid atmosphere treatment.

Note that the acid concentration of the dry air containing acetic acid gas (concretely, an acetic acid gas concentration) to be supplied to the wafer W at this step is, for example, 10 $\mu g/m^3$ or more. Further, the acid concentration is set to, for example, less than 10 $ng/m^3$ in a space (including the above transfer space) other than the treatment space K in the acid atmosphere treatment unit 32 of the wafer existence space in the coating and developing treatment apparatus 1.

Step S4

Subsequently, the PAB treatment is performed.

Concretely, the wafer W is transferred by the transfer unit 70 to the thermal treatment unit 40 for the PAB treatment and subjected to the PAB treatment. The wafer W is then transferred by the transfer unit 70 to the delivery unit 56 in the third block G3, then transferred by the transfer unit 90 to the delivery unit 52, and transferred by the shuttle transfer unit 80 to the delivery unit 62 in the fourth block G4.

Step S5

Subsequently, the exposure treatment is performed.

Specifically, the wafer W is transferred by the transfer unit 100 in the interface station 5 to the exposure apparatus 4, and the resist film on the wafer W is exposed in a predetermined pattern using EUV light. The wafer W is then transferred by the transfer apparatus 100 to the delivery unit 60 in the fourth block G4.

Step S6

Next, the PEB treatment is performed.

Specifically, the wafer W is transferred by the transfer unit 70 to thermal treatment unit 40 for the PEB treatment and subjected to the PEB treatment.

Step S7

Subsequently, a developing treatment is performed.

Specifically, the wafer W is transferred to the developing treatment unit 30 and subjected to the developing treatment, whereby a line-and-space resist pattern is formed.

Step S8

Thereafter, a POST treatment is performed.

Specifically, the wafer W is transferred to the thermal treatment apparatus 40 for the POST treatment and subjected to the POST treatment.

Step S9

Then, the wafer W is transferred out of the coating and developing treatment apparatus 1.

Specifically, the wafer W is returned to the cassette C by a procedure reverse to that at Step S1.

This completes a series of wafer treatments.

As explained above, in Example 1 of the wafer treatment, the line width of the pattern of the metal-containing resist can be controlled to be smaller because the acid atmosphere treatment is performed after the resist coating treatment and before the PAB treatment. In particular, in Example 1 of the wafer treatment, the acid atmosphere treatment is locally performed only on the treatment target region in which the line width becomes larger than that in the other region if the acid atmosphere treatment is not performed on the wafer W, thus making it possible to make the line width in the treatment target region smaller and to make the line width more uniform within the wafer.

Figure 14:
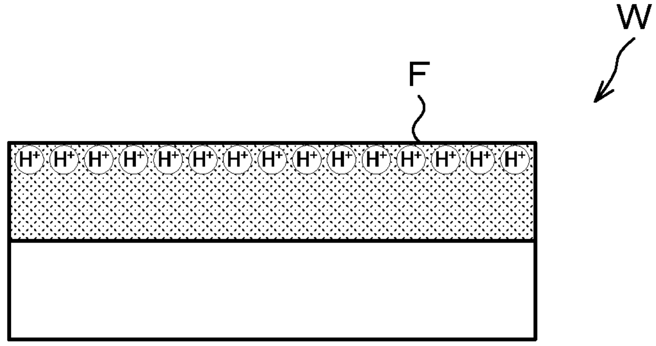
FIG. 14 is a view for explaining the effect of the line width becoming smaller by the acid atmosphere treatment in Example 1 of the wafer treatment.
Figure 15:
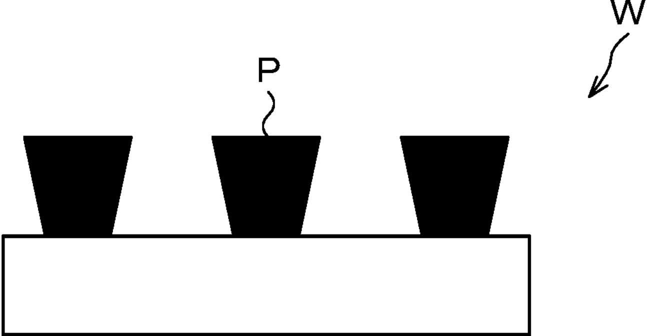
FIG. 15 is a view for explaining the effect of the line width becoming smaller by the acid atmosphere treatment in Example 1 of the wafer treatment.
Figure 16:
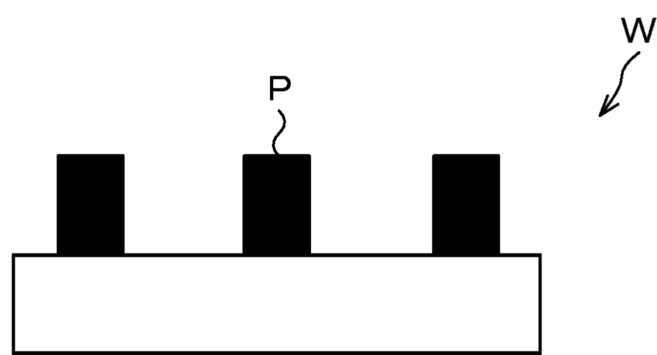
FIG. 16 is a view for explaining the effect of the line width becoming smaller by the acid atmosphere treatment in Example 1 of the wafer treatment.

Further, in Example 1 of the wafer treatment, $H^+$ as a catalyst is supplied by the acid atmosphere treatment to the surface (top surface) of a metal-containing resist film F on the wafer W as illustrated in FIG. 14. Therefore, the effect of making the line width smaller by the acid atmosphere treatment is greater at an upper portion of the pattern of the metal-containing resist. Accordingly, in the case where a pattern-shape collapse such as the line width becoming larger at the upper portion than at a lower portion of a pattern P of the metal-containing resist as illustrated in FIG. 15 occurs if the acid atmosphere treatment is not performed at all, the acid atmosphere treatment is performed as in Example 1 of the wafer treatment, thereby obtaining the following effect. Specifically, it is possible to make the line width of the pattern P of the metal-containing resist uniform irrespective of the position in the height direction as illustrated in FIG. 16.

Further, in the case where the pattern-shape collapse such as the line width becoming larger at the upper portion as above occurs at a portion of the wafer W if the acid atmosphere treatment is not performed at all, the acid atmosphere treatment is locally performed as in Example 1 of the wafer treatment and the treatment target region is set as the region where the pattern-shape collapse occurs, thereby making it possible to make the pattern shape of the metal-containing resist more uniform within the wafer.

Example 2 of the Wafer Treatment

Figure 17:
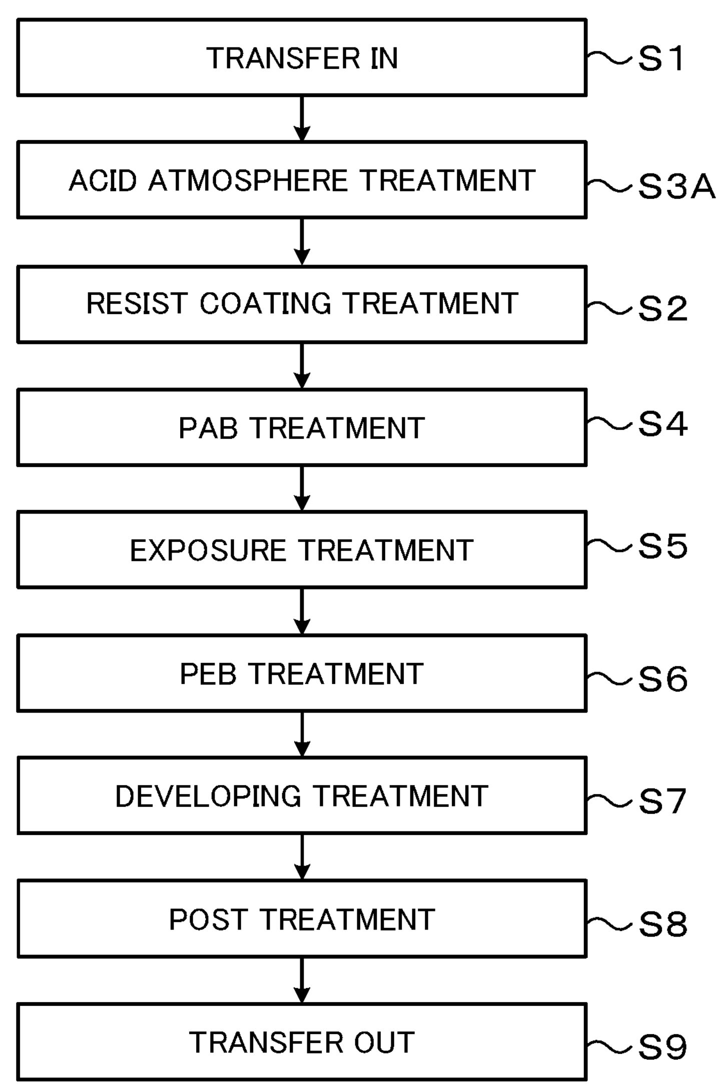
FIG. 17 is a flowchart illustrating main steps of Example 2 of the wafer treatment.

FIG. 17 is a flowchart illustrating main steps of Example 2 of the wafer treatment.

In view of the fact that $H^+$ as a catalyst is supplied to the surface (namely, the top surface) of the metal-containing resist film on the wafer W by performing the acid atmosphere treatment after the resist coating treatment and before the PAB treatment, the following point (X') is inferred from the above finding (X).

(X') Performing the acid atmosphere treatment before the resist coating treatment and supplying $H^+$ as a catalyst to the lower surface of the metal-containing resist film formed on the wafer W makes it possible to make the line width of the pattern of the metal-containing resist smaller.

In Example 2 of the wafer treatment, the acid atmosphere treatment is performed between the transfer of the wafer W to the inside of the coating and developing treatment apparatus 1 and the resist coating treatment, more specifically, before the resist coating treatment based on the above inference (X').

More specifically, in Example 2 of the wafer treatment, first, the wafer W is transferred to the inside of the coating and developing treatment apparatus 1 (Step S1) as in Example 1 of the wafer treatment as illustrated in FIG. 17.

Then, unlike Example 1 of the wafer treatment, the acid atmosphere treatment (Step S3A) is performed before the resist coating treatment (Step S2).

Specifically, as in above Step S3, the acid atmosphere treatment is locally performed on the treatment target region. This supplies $H^+$ as a catalyst to the surface of the base film in the treatment target region.

Thereafter, the resist coating treatment (Step S2), the PAB treatment (Step S4), the exposure treatment (Step S5), the PEB treatment (Step S6), the developing treatment (Step S7), the POST treatment (Step S8), and the transfer of the wafer W out of the coating and developing treatment apparatus 1 (Step S9) are performed in this order.

This completes a series of wafer treatments.

As explained above, in Example 2 of the wafer treatment, the line width of the pattern of the metal-containing resist can be controlled to be smaller because the acid atmosphere treatment is performed before the resist coating treatment. In particular, in Example 2 of the wafer treatment, the acid atmosphere treatment is locally performed only on the treatment target region in which the line width becomes larger than that in the other region if the acid atmosphere treatment is not performed on the wafer W, thus making it possible to make the line width in the treatment target region smaller and to make the line width more uniform within the wafer.

Figure 18:
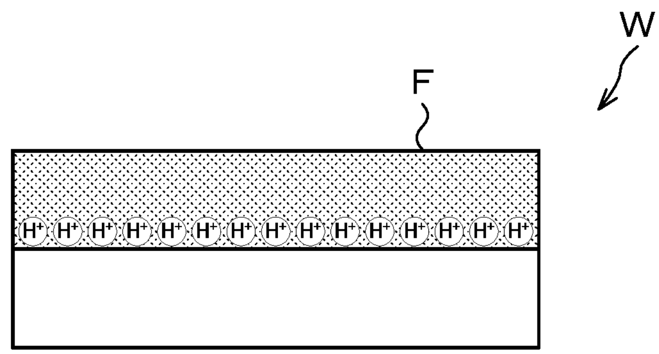
FIG. 18 is a view for explaining the effect of the line width becoming smaller by the acid atmosphere treatment in Example 2 of the wafer treatment.
Figure 19:
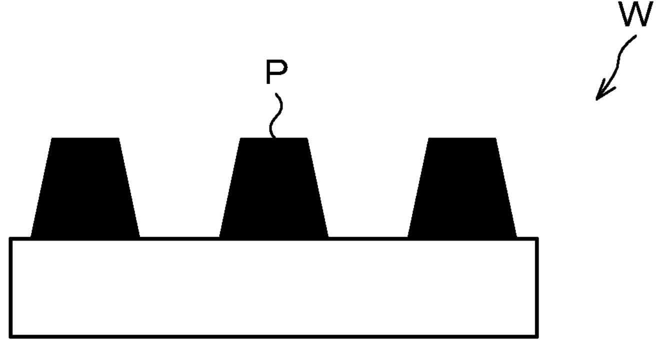
FIG. 19 is a view for explaining the effect of the line width becoming smaller by the acid atmosphere treatment in Example 2 of the wafer treatment.

Further, in Example 2 of the wafer treatment, $H^+$ as a catalyst is supplied by the acid atmosphere treatment to the lower surface of the metal-containing resist film F on the wafer W as illustrated in FIG. 18. Therefore, the effect of making the line width smaller by the acid atmosphere treatment is greater at the lower portion of the pattern of the metal-containing resist. Accordingly, in the case where a pattern-shape collapse such as the line width becoming larger at the lower portion than at the upper portion of the pattern P of the metal-containing resist as illustrated in FIG. 19 occurs if the acid atmosphere treatment is not performed at all, the acid atmosphere treatment is performed as in Example 2 of the wafer treatment, thereby obtaining the following effect. Specifically, it is possible to make the line width of the pattern P of the metal-containing resist uniform irrespective of the position in the height direction as illustrated in FIG. 16.

Further, in the case where the pattern-shape collapse such as the line width becoming larger at the lower portion as above occurs at a portion of the wafer W if the acid atmosphere treatment is not performed at all, the acid atmosphere treatment is locally performed as in Example 2 of the wafer treatment and the treatment target region is set as the region where the pattern-shape collapse occurs, thereby obtaining the following effect. Specifically, it is possible to make the pattern shape of the metal-containing resist more uniform within the wafer.

Example 3 of the Wafer Treatment

Figure 20:
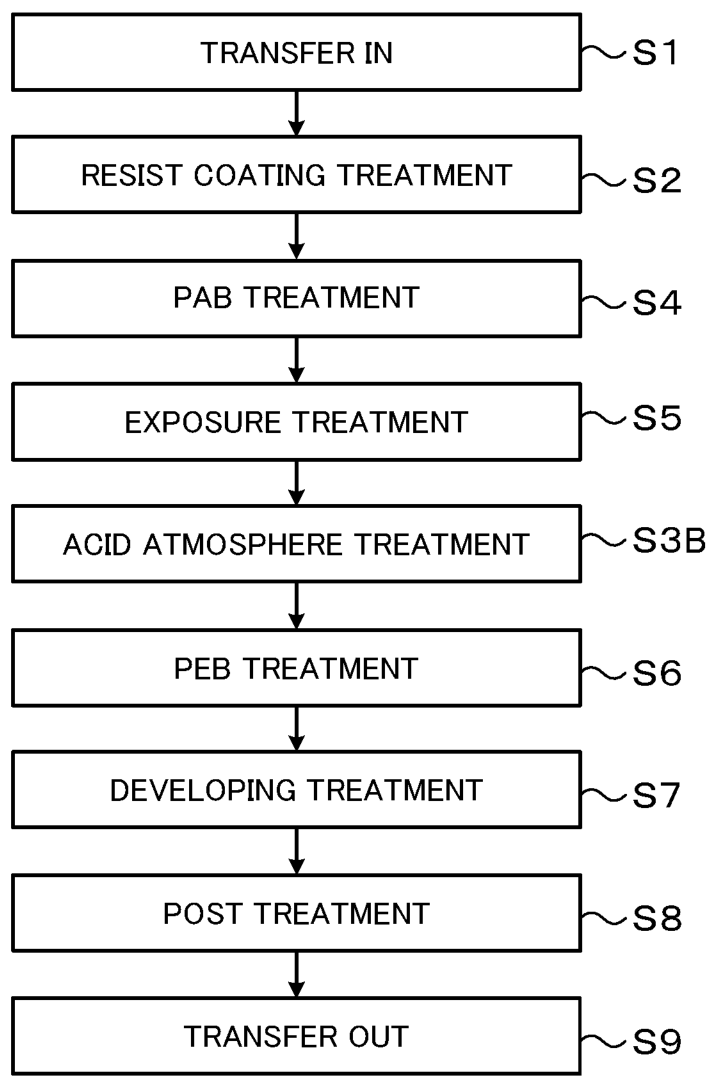
FIG. 20 is a flowchart illustrating main steps of Example 3 of the wafer treatment.

FIG. 20 is a flowchart illustrating main steps of Example 3 of the wafer treatment. In Example 3 of the wafer treatment, the acid atmosphere treatment is performed between the exposure treatment and the PEB treatment, more specifically, after the exposure treatment and before the PEB treatment based on the above finding (Y).

More specifically, in Example 3 of the wafer treatment, first, the transfer of the wafer W to the inside of the coating and developing treatment apparatus 1 (Step S1) and the resist coating treatment (Step S2) are performed in this order as in Example 1 of the wafer treatment as illustrated in FIG. 20.

Subsequently, the PAB treatment (Step S4) and the exposure treatment (Step S5) are performed in this order after the resist coating treatment (Step S2), unlike Example 1 of the wafer treatment. Thereafter, the acid atmosphere treatment (Step S3B) is performed.

Specifically, the acid atmosphere treatment is locally performed on the treatment target region as in above Step S3. This supplies $H^+$ as a catalyst to the surface of the metal-containing resist film after exposure in the treatment target region.

After the acid atmosphere treatment, the PEB treatment (Step S6), the developing treatment (Step S7), the POST treatment (Step S8), and the transfer of the wafer W out of the coating and developing treatment apparatus 1 (Step S9) are performed in this order.

This completes a series of wafer treatments.

As explained above, in Example 3 of the wafer treatment, the line width of the pattern of the metal-containing resist can be controlled to be smaller because the acid atmosphere treatment is performed after the exposure treatment and before the PEB treatment. In particular, in Example 3 of the wafer treatment, the acid atmosphere treatment is locally performed only on the treatment target region in which the line width becomes larger than that in the other region if the acid atmosphere treatment is not performed on the wafer W, thus making it possible to make the line width in the treatment target region smaller and to make the line width more uniform within the wafer.

Further, in Example 3 of the wafer treatment, $H^+$ as a catalyst is supplied by the acid atmosphere treatment to the surface of the metal-containing resist film F on the wafer W as in Example 1 of the wafer treatment. However, a great difference in reaction speed occurs depending on the presence or absence of the supply of the catalyst because the acid atmosphere treatment is performed before exposure and the hydrolysis reaction amount is small (namely, there is room for the hydrolysis reaction to proceed) in Example 1 of the wafer treatment, whereas a difference in reaction speed of the hydrolysis depending on the presence or absence of the supply of the catalyst is unlikely to occur because the acid atmosphere treatment is performed after exposure and the hydrolysis reaction is almost completed in Example 3 of the wafer treatment. Therefore, the effect of making the line width smaller by the acid atmosphere treatment in Example 3 of the wafer treatment is almost the same at the upper portion and at the lower portion of the pattern of the metal-containing resist. In other words, according to Example 3 of the wafer treatment, it is possible to make the line width of the pattern of the metal-containing resist almost uniformly smaller irrespective of the position in the height direction.

Example 4 of the Wafer Treatment

Figure 21:
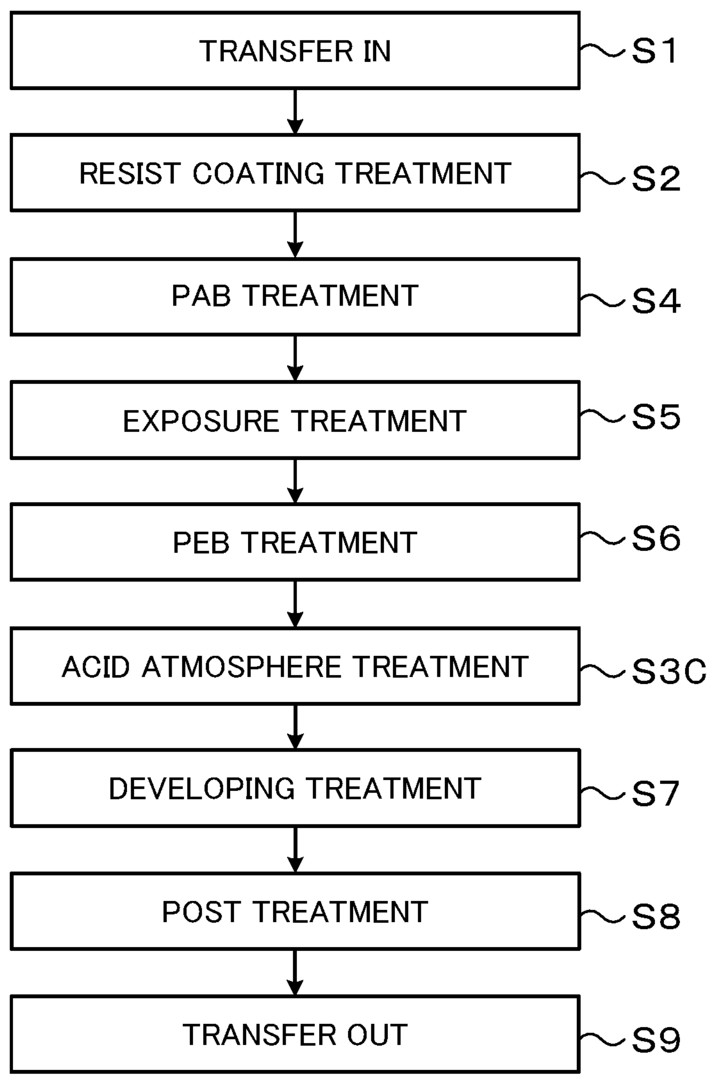
FIG. 21 is a flowchart illustrating main steps of Example 4 of the wafer treatment.

FIG. 21 is a flowchart illustrating main steps of Example 4 of the wafer treatment. In Example 4 of the wafer treatment, the acid atmosphere treatment is performed between the PEB treatment and the developing treatment, more specifically, after the PEB treatment and before the developing treatment based on the above finding (Z).

More specifically, in Example 4 of the wafer treatment, first, the transfer of the wafer W to the inside of the coating and developing treatment apparatus 1 (Step S1), the resist coating treatment (Step S2), the PAB treatment (Step S4), and the exposure treatment (Step S5) are performed in this order as in Example 3 of the wafer treatment as illustrated in FIG. 21. Then, the PEB treatment (Step S6) is performed unlike Example 3 of the wafer treatment.

Thereafter, the acid atmosphere treatment (Step S3C) is performed.

Specifically, the acid atmosphere treatment is locally performed on the treatment target region as in above Step S3. This supplies $H^+$ as a catalyst to the surface of the metal-containing resist film after the PEB treatment in the treatment target region. However, the treatment target region for the acid atmosphere treatment in Example 4 is a region in which the line width of the metal-containing resist becomes smaller than that in the other region if the acid atmosphere treatment is not performed on the region unlike Example 1 of the wafer treatment.

After the acid atmosphere treatment, the developing treatment (Step S7), the POST treatment (Step S8), and the transfer of the wafer W out of the coating and developing treatment apparatus 1 (Step S9) are performed in this order.

This completes a series of wafer treatments.

As explained above, in Example 4 of the wafer treatment, the line width of the pattern of the metal-containing resist can be controlled to be larger because the acid atmosphere treatment is performed after the PEB treatment and before the developing treatment. In particular, in Example 4 of the wafer treatment, the acid atmosphere treatment is locally performed only on the treatment target region in which the line width becomes smaller than that in the other region if the acid atmosphere treatment is not performed on the wafer W, thus making it possible to make the line width in the treatment target region larger and to make the line width more uniform within the wafer.

Further, in Example 4 of the wafer treatment, $H^+$ as a catalyst is supplied by the acid atmosphere treatment to the surface of the metal-containing resist film F on the wafer W as in Example 1 of the wafer treatment. However, in Example 4 of the wafer treatment, the acid atmosphere treatment is performed after the PEB treatment and the dehydration condensation is more dominant than the hydrolysis but the dehydration condensation proceeds to some extent unlike Example 1 of the wafer treatment, so that a difference in reaction speed of the dehydration condensation depending on the presence or absence of the supply of the catalyst is unlikely to occur. Therefore, the effect of making the line width larger by the acid atmosphere treatment in Example 4 of the wafer treatment is almost the same at the upper portion and at the lower portion of the pattern of the metal-containing resist. In other words, according to Example 4 of the wafer treatment, it is possible to make the line width of the pattern of the metal-containing resist almost uniformly larger irrespective of the position in the height direction.

Further, according to Example 4 of the wafer treatment, it is possible to obtain the pattern of the metal-containing resist with a large line width even with a low exposure amount. More specifically, according to Example 4 of the wafer treatment, it is possible to suppress the exposure amount for obtaining the pattern with the target line width. Therefore, it is possible to suppress the power consumed in the exposure apparatus 4 for EUV requiring large power, thereby reducing the $CO_2$ emission accompanying the power generation.

As explained above, this disclosure is a method of performing a treatment for forming the pattern of the metal-containing resist on the wafer W, which changes the acid concentration in the wafer existence space before the developing treatment. According to this method, it is possible to appropriately control the line width of the pattern of the metal-containing resist.

Modification Example

The acid atmosphere treatment by the acid atmosphere treatment unit 32 is performed only for one period (namely, only once) between completion of the transfer of the wafer W to the inside of the coating and developing treatment apparatus 1 and the developing treatment in the above. In place of this, the acid atmosphere treatment by the acid atmosphere treatment unit 32 may be performed for each of a plurality of periods included between completion of the transfer of the wafer W to the inside of the coating and developing treatment apparatus 1 and the developing treatment.

The plurality of periods are, for example, two periods before the PEB treatment and after the PEB treatment. Further, before the PEB treatment means at least one of between the resist coating treatment and the exposure treatment (concretely, between the resist coating treatment and the PAB treatment), and between the exposure treatment and the post exposure bake treatment.

Hereinafter, the reason for performing the acid atmosphere treatment by the acid atmosphere treatment unit 32 both before the PEB treatment and after the PEB treatment will be explained.

Figure 22:
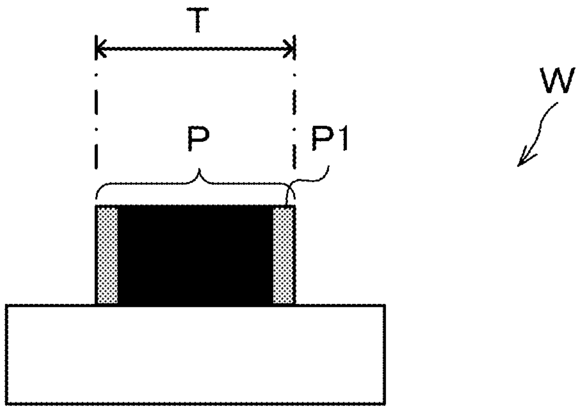
FIG. 22 is a view for explaining a reason for performing the acid atmosphere treatment both before the PEB treatment and after the PEB treatment.

As explained using FIG. 5, the intermediately exposed region A3 which is exposed but is smaller in exposure amount than the center of the exposed region A1 exists at the portion, close to the unexposed region A2, in the exposed region A1 of the metal-containing resist. Even if a pattern P of the metal-containing resist with a target line width T is obtained as illustrated in FIG. 22 by the conventional method which does not perform the acid atmosphere treatment at all, the density of the potion P1 is insufficient to result in insufficient etching resistance of the pattern P if a portion P1 corresponding to the intermediately exposed region A3 is included in the pattern P.

Figure 23:
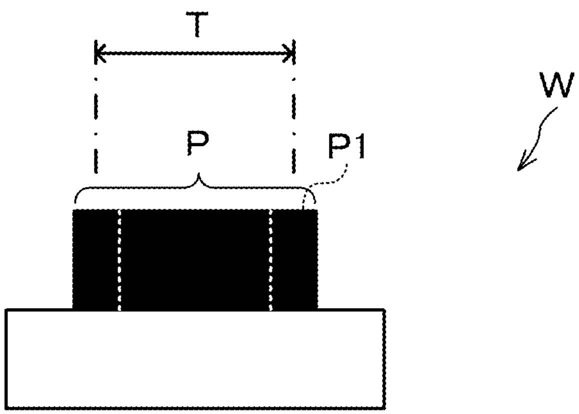
FIG. 23 is a view for explaining the reason for performing the acid atmosphere treatment both before the PEB treatment and after the PEB treatment.

By performing the acid atmosphere treatment after the PEB treatment, the dehydration condensation proceeds in the intermediately exposed region A3 to increase the density of the portion corresponding to the intermediately exposed region A3 in the pattern of the metal-containing resist. However, the portion P1 corresponding to the intermediately exposed region A3 in the pattern of the metal-containing resist possibly spreads as illustrated in FIG. 23 to result in that the line width of the pattern becomes larger than the target line width T.

Hence, the acid atmosphere treatment is performed both before the PEB treatment and after the PEB treatment.

Figure 24:
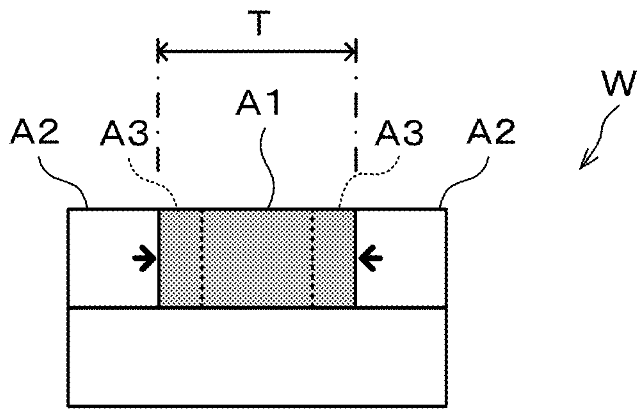
FIG. 24 is a view for explaining the reason for performing the acid atmosphere treatment both before the PEB treatment and after the PEB treatment.
Figure 25:
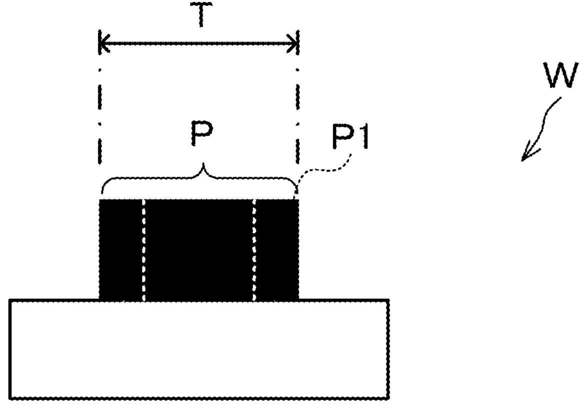
FIG. 25 is a view for explaining the reason for performing the acid atmosphere treatment both before the PEB treatment and after the PEB treatment.

More specifically, performing the acid atmosphere treatment before the PEB treatment makes it as if substantially the entire intermediately exposed region A3 moves to the inside of the region having the target line width T as illustrated in FIG. 24. Then, the acid atmosphere treatment is performed also after the PEB treatment to densify substantially the entire intermediately exposed region A3. The pattern P obtained thereafter by development includes the portion P1 corresponding to the intermediately exposed region A3 as illustrated in FIG. 25 but is high in density and etching resistance as a whole including the portion P1 and has the target line width T.

In other words, it is possible to improve the etching resistance of the pattern while suppressing the line width of the pattern, Besides, the acid atmosphere treatment is locally performed on the wafer W in the above examples, but the acid atmosphere treatment may be performed on the entire surface of the wafer W.

Figure 26:
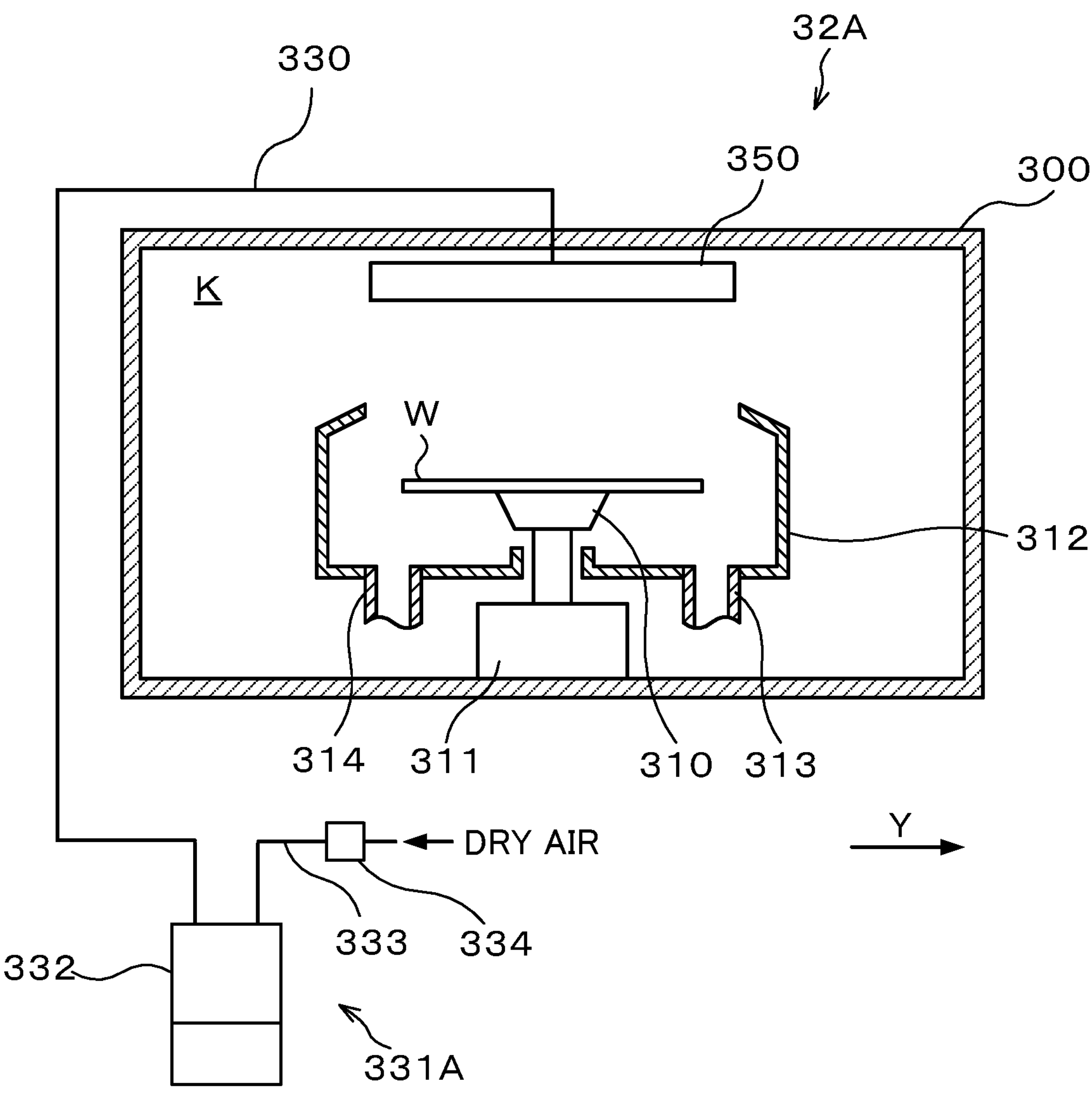
FIG. 26 is a longitudinal sectional view illustrating the outline of another example of the acid atmosphere treatment unit.

FIG. 26 is a longitudinal sectional view illustrating the outline of another example of the acid atmosphere treatment unit.

The acid atmosphere treatment unit 32A in FIG. 26 is an apparatus for performing the acid atmosphere treatment on the entire surface of the wafer W, and has a spin chuck 310 and a cup 312 as in the acid atmosphere treatment unit 32 in FIG. 11. However the acid atmosphere treatment unit 32A does not have the discharge nozzle 322 and the FFU 340 unlike the acid atmosphere treatment unit 32 in FIG. 11, but has a gas flow forming unit 350 instead. The gas flow forming unit 350 forms a descending current of dry air containing an acetic acid gas as the treatment gas containing acid gas and supplies the dry air to the entire surface of the wafer W in the cup 312 at once.

The gas flow forming unit 350 is connected to a supply mechanism 331A via a supply pipe 330. The supply mechanism 331A supplies the dry air containing acetic acid gas to the gas flow forming unit 350. In the supply mechanism 331A, by supplying dry air from a supply source (not illustrated) of the dry air to the bottle 332 via the supply pipe 333, the dry air containing acetic acid gas can be supplied to the gas flow forming unit 350 via the supply pipe 330.

The gas flow forming unit 350 may be configured to freely rise and lower. In the case where the gas flow forming unit 350 is configured to freely rise and lower, the gas flow forming unit 350 may be lowered such that the gas flow forming unit 350 can close the upper opening of the cup 312 in the acid atmosphere treatment.

As in the above-explained Example 1 of the wafer treatment, performing the acid atmosphere treatment on the entire surface of the wafer W after the resist coating treatment and before the PAB treatment makes it possible to make the line width of the pattern of the metal-containing resist and the pattern shape of the metal-containing resist uniform among different wafers W.

Further, performing the acid atmosphere treatment on the entire surface of the wafer W after the transfer of the wafer W to the inside of the coating and developing treatment apparatus 1 and before the resist coating treatment as in the above-explained Example 2 of the wafer treatment makes it possible to make the line width of the pattern of the metal-containing resist and the pattern shape of the metal-containing resist uniform among different wafers W.

Performing the acid atmosphere treatment on the entire surface of the wafer W after the exposure treatment and before the PEB treatment as in the above-explained Example 3 of the wafer treatment makes it possible to make the line width of the pattern of the metal-containing resist uniform among different wafers W.

Performing the acid atmosphere treatment on the entire surface of the wafer W after the PEB treatment and before the developing treatment as in the above-explained Example 4 of the wafer treatment makes it possible to make the line width of the pattern of the metal-containing resist uniform among different wafers W and to reduce the $CO_2$ emission.

Note that the acid atmosphere treatment on the entire surface of the wafer W may be performed not in the acid atmosphere treatment unit 32A in FIG. 26 but in the acid atmosphere treatment unit 32 in FIG. 11.

Besides, the acetic acid gas is used as the acid gas for the acid atmosphere treatment in the above examples, but another organic acid gas may be used or an acid gas other than the organic acid gas may be used. Note that for the acid atmosphere treatment performed after the PEB treatment and before the developing treatment, gas of a carboxylic acid such as acetic acid, citric acid, oxalic acid, formic acid or the like is preferably used.

The base film of the metal-containing resist is the SoC film in the above examples. However, the base film is not limited to the SoC film, but may be a SiC film or a film used as a silicon-containing anti-reflection coating film.

Further, the SoC film as the base film of the metal-containing resist has been formed on the wafer W in advance in the above examples, but the base film may be formed in the coating and developing treatment apparatus 1.

Further, the acid atmosphere treatment unit is separate from the solution treatment unit such as the developing treatment unit 30 in the above examples, but may be integrated therewith.

The acid atmosphere treatment unit is provided in a region overlapped in plan view with the solution treatment unit such as the developing treatment unit 30 in the treatment station 3 in the above examples, but may be provided in another region in the treatment station 3. Besides, the acid atmosphere treatment unit may be provided in a region other than the treatment station 3 in the coating and developing treatment apparatus 1. For example, in the case where the acid atmosphere treatment is performed after the exposure treatment and before the PEB treatment, the acid atmosphere treatment unit which performs the acid atmosphere treatment may be provided in the interface station 5. This can improve the throughput in the case of performing the acid atmosphere treatment.

The acid atmosphere treatment unit is incorporated in the coating and developing treatment apparatus in the above examples. In other words, the apparatus which performs the acid atmosphere treatment and the coating and developing treatment apparatus are integrated. However, the apparatus which performs the acid atmosphere treatment may be separated from the coating and developing treatment apparatus. More specifically, the apparatus which performs the acid atmosphere treatment may be a separate apparatus from the apparatus which performs at least one of the resist coating treatment, the PAB treatment, the PEB treatment, and the developing treatment.

The embodiments disclosed herein are merely examples in all respects and should not be considered to be restrictive. The above embodiments may be abbreviated, replaced, or changed in various forms without departing from the scope and spirit of the attached claims.

According to this disclosure, it is possible to provide novel substrate treatment method and substrate treatment apparatus capable of controlling a line width of a resist pattern using a metal-containing resist.

What is claimed is:

1. A substrate treatment method of performing a treatment for forming a pattern of a metal-containing resist on a substrate, the substrate treatment method comprising increasing an acid concentration in a substrate existence space where the substrate exists in a substrate treatment apparatus during a period after an exposure treatment on a film of the metal-containing resist and before transferring into a part for performing a post exposure bake treatment.

2. The substrate treatment method according to claim 1, wherein:

the substrate existence space includes:

a treatment space where a predetermined treatment is performed on the substrate; and a transfer space where a transfer mechanism configured to transfer the substrate to the treatment space is provided; and the acid concentration in the treatment space is increased, when the acid concentration in the substrate existence space is changed; and the acid concentration in the transfer space is maintained equal to or lower than a minimum acid concentration in the treatment space by feeding air with an adjusted acid concentration.

3. The substrate treatment method according to claim 2, wherein:

the acid concentration of the air is adjusted by a collection component that collects acidic fluid.

4. The substrate treatment method according to claim 1, wherein the acid concentration in the substrate existence space is increased between a formation of the film of the metal-containing resist and an exposure treatment on the film.

5. The substrate treatment method according to claim 1, wherein the acid concentration in the substrate existence space is increased between an exposure treatment on the film of the metal-containing resist and a post exposure bake treatment.

6. The substrate treatment method according to claim 1, wherein the acid concentration in the substrate existence space is increased between a post exposure bake treatment and the exposure treatment.

7. The substrate treatment method according to claim 1, wherein the acid concentration in the substrate existence space is increased between transfer of the substrate to an inside of the substrate treatment apparatus and a formation of the film of the metal-containing resist.

8. The substrate treatment method according to claim 1, wherein the acid concentration in the substrate existence space is increased in each of a plurality of periods included before the exposure treatment.

9. The substrate treatment method according to claim 8, wherein the plurality of periods are before the post exposure bake treatment and after the post exposure bake treatment.

10. A substrate treatment apparatus for performing a treatment for forming a pattern of a metal-containing resist on a substrate, the substrate treatment apparatus comprising an acid concentration change part configured to increase an acid concentration in a substrate existence space where the substrate exists in the substrate treatment apparatus during a period after an exposure treatment on a film of the metal-containing resist and before transferring into a part for performing a post exposure bake treatment.

11. The substrate treatment apparatus according to claim 10, wherein:

the substrate existence space includes:

a treatment space where a predetermined treatment is performed on the substrate; and a transfer space where a transfer mechanism configured to transfer the substrate to the treatment space is provided; and the acid concentration change part increases the acid concentration in the treatment space when changing the acid concentration in the substrate existence space; and the acid concentration in the transfer space is maintained equal to or lower than a minimum acid concentration in the treatment space by feeding air with an adjusted acid concentration.

12. The substrate treatment apparatus according to claim 11, further comprising:

a collection component that collects acidic fluid, wherein the acid concentration of the air is adjusted by the collection component.

13. The substrate treatment apparatus according to claim 10, wherein the acid concentration change part increases the acid concentration in the substrate existence space in each of a plurality of periods included before the exposure treatment.

14. A substrate treatment method of performing a treatment for forming a pattern of a metal-containing resist on a substrate, the substrate treatment method comprising increasing an acid concentration in a substrate existence space where the substrate exists in a substrate treatment apparatus during a period after transferring out from a part for performing a post exposure bake treatment and before a developing treatment of a film of the metal-containing resist.

15. A substrate treatment apparatus for performing a treatment for forming a pattern of a metal-containing resist on a substrate, the substrate treatment apparatus comprising an acid concentration change part configured to increase an acid concentration in a substrate existence space where the substrate exists in the substrate treatment apparatus during a period after transferring out from a part for performing a post exposure bake treatment and before a developing treatment of a film of the metal-containing resist.

* * * * *